(12) United States Patent
    Nomoto

(10) Patent No.: US 8,277,901 B2
(45) Date of Patent: *Oct. 2, 2012

(54) PATTERNING METHOD, METHOD OF MANUFACTURING ORGANIC FIELD EFFECT TRANSISTOR, AND METHOD OF MANUFACTURING FLEXIBLE PRINTED CIRCUIT BOARD

(75) Inventor: Akihiro Nomoto, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/072,234

(22) Filed: Feb. 25, 2008

(65) Prior Publication Data

US 2008/0155818 A1    Jul. 3, 2008

Related U.S. Application Data

(62) Division of application No. 11/385,123, filed on Mar. 21, 2006.

(30) Foreign Application Priority Data

Mar. 23, 2005  (JP) ................. 2005-083456

(51) Int. Cl.
    *B05D 5/12*  (2006.01)
(52) U.S. Cl. ...... 427/421.1; 427/58; 427/98.5; 427/256; 438/142
(58) Field of Classification Search .............. 427/98.5, 427/256, 58
    See application file for complete search history.

(56) References Cited

U.S. PATENT DOCUMENTS

| | | | |
|---|---|---|---|
| 4,576,109 A * | 3/1986 | Bok ................... | 118/50 |
| H1145 H | 3/1993 | Anderson | |
| 6,344,088 B1 | 2/2002 | Kamikihara et al. | |
| 6,794,220 B2 | 9/2004 | Hirai et al. | |
| 2002/0075422 A1* | 6/2002 | Kimura et al. ............ | 349/43 |
| 2002/0108649 A1* | 8/2002 | Fujimori et al. ........... | 136/263 |
| 2002/0151161 A1* | 10/2002 | Furusawa ................. | 438/597 |
| 2002/0168805 A1* | 11/2002 | Lee ........................ | 438/149 |
| 2002/0197454 A1 | 12/2002 | Boussie et al. | |
| 2003/0064159 A1* | 4/2003 | Motomura ................ | 427/372.2 |
| 2003/0179191 A1 | 9/2003 | Matsuda et al. | |
| 2004/0082163 A1* | 4/2004 | Mori et al. ................ | 438/630 |

(Continued)

FOREIGN PATENT DOCUMENTS

| | | |
|---|---|---|
| JP | 2004-128469 A | 4/2004 |
| JP | 2004-145090 A | 5/2004 |
| JP | 2004-319731 A | 11/2004 |

(Continued)

OTHER PUBLICATIONS

Chabinyc et al. "Organic polymeric thin-film transistors fabricated by selective dewetting" 2002, Applied Physics Letters, vol. 81 No. 22, pp. 4260-4262.

*Primary Examiner* — Timothy Meeks
*Assistant Examiner* — Nathan T Leong
(74) *Attorney, Agent, or Firm* — Wolf, Greenfield & Sacks, P.C.

(57) ABSTRACT

In the condition where a nozzle for applying a coating liquid is disposed on the lower side of a substrate and a substrate surface controlled in wettability is faced down, the nozzle and the substrate are moved relative to each other, whereby the coating liquid is applied to a desired region of the substrate, and then the coating liquid is dried, to obtain a pattern included a dried coating layer.

9 Claims, 12 Drawing Sheets

U.S. PATENT DOCUMENTS

| | | | | |
|---|---|---|---|---|
| 2004/0201048 A1* | 10/2004 | Seki et al. | ............... | 257/294 |
| 2004/0201064 A1* | 10/2004 | Hirai et al. | ............... | 257/347 |
| 2005/0029567 A1* | 2/2005 | Mori | ............... | 257/298 |
| 2008/0155818 A1 | 7/2008 | Nomoto | | |

FOREIGN PATENT DOCUMENTS

| | | |
|---|---|---|
| JP | 2005-062356 A | 3/2005 |
| JP | 2005-064249 A | 3/2005 |
| JP | 2005-072569 A | 3/2005 |

* cited by examiner

FIG.4A [STEP 100]
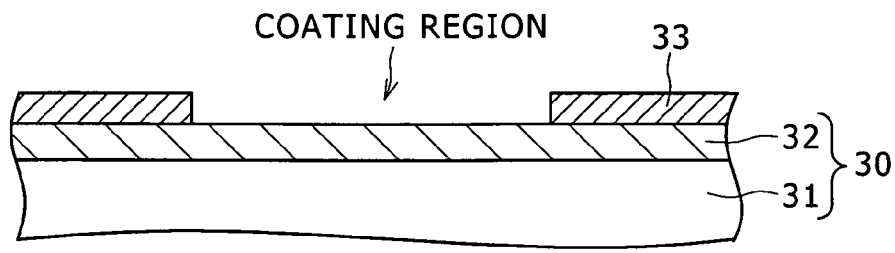
FIG.4B [STEP 100] (CONTD.)
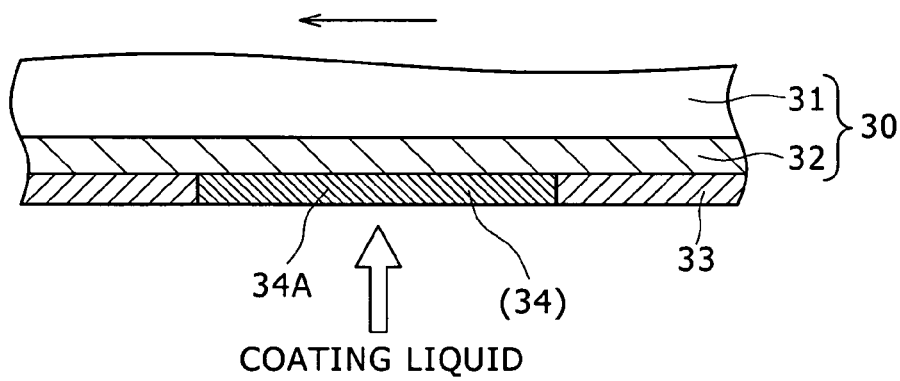
FIG.4C [STEP 100] (CONTD.)
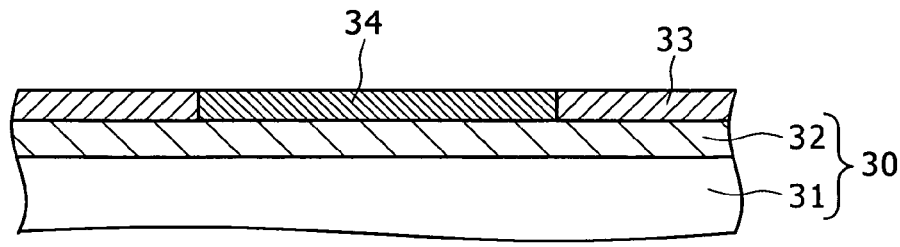
FIG.4D [STEP 110]
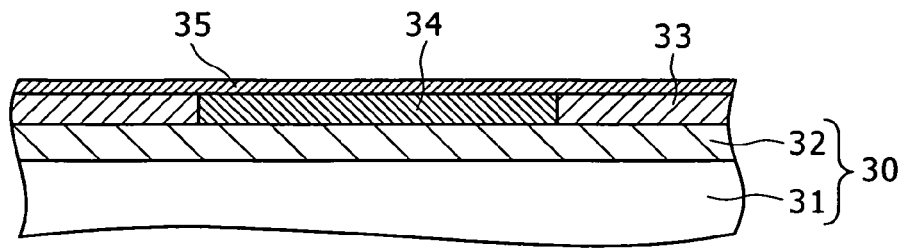

FIG. 5A [STEP 120]
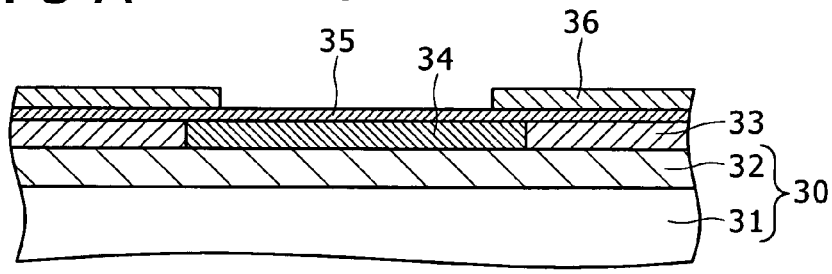
FIG. 5B [STEP 130]
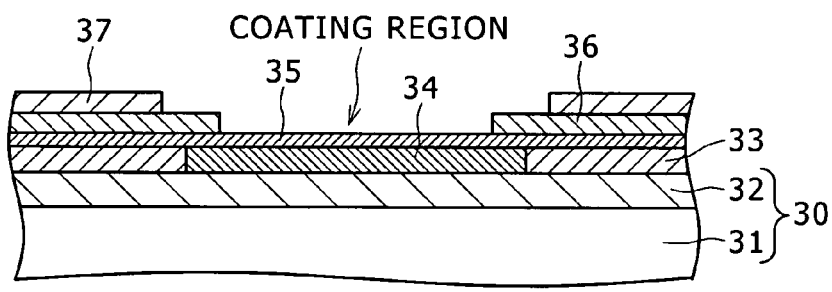
FIG. 5C [STEP 130] (CONTD.)
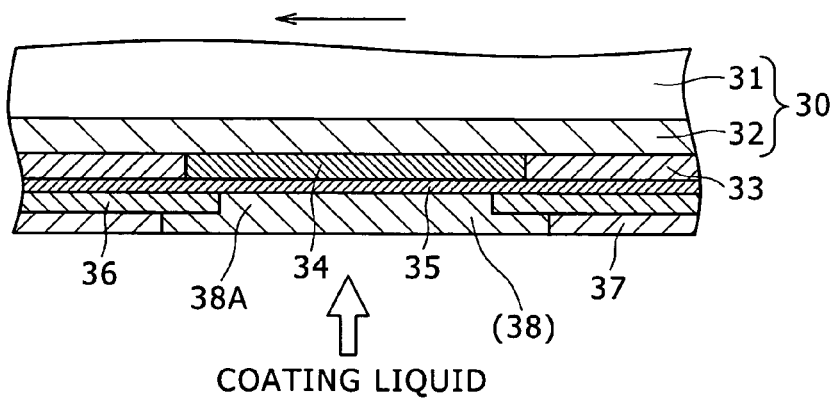
FIG. 5D [STEP 130] (CONTD.)
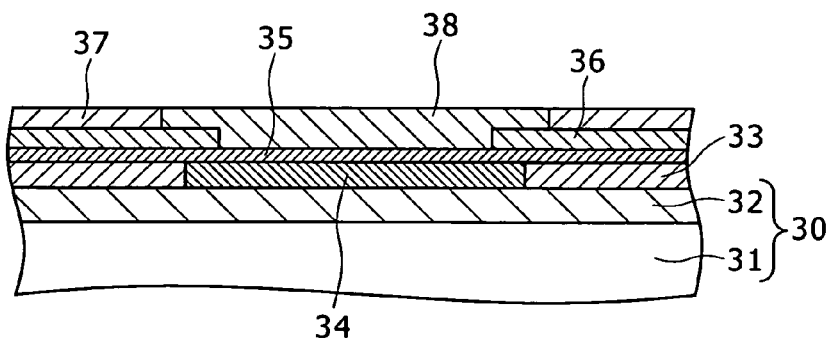

FIG. 6A [STEP 210]
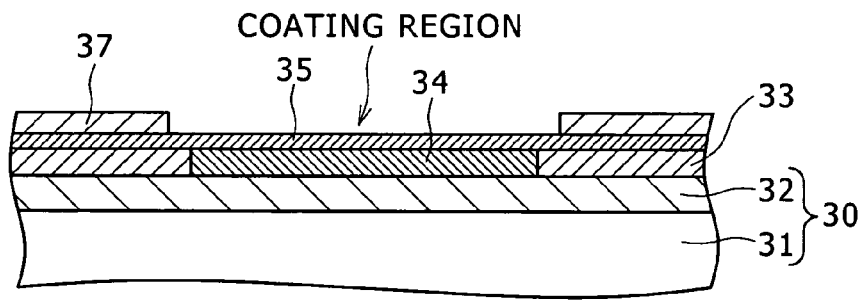
FIG. 6B [STEP 210] (CONTD.)
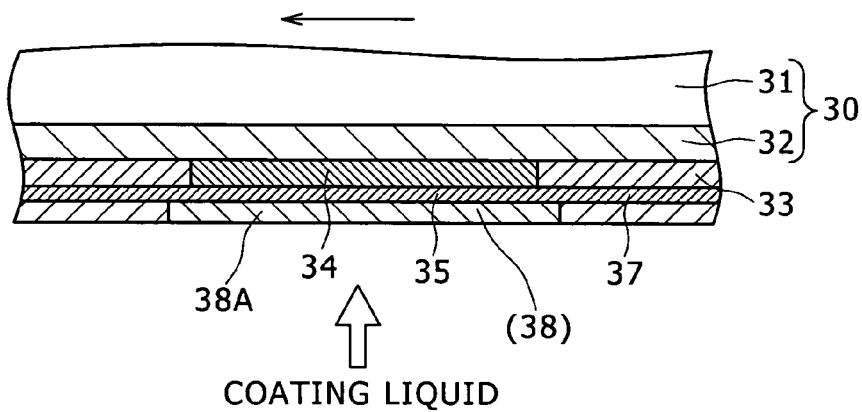
FIG. 6C [STEP 210] (CONTD.)
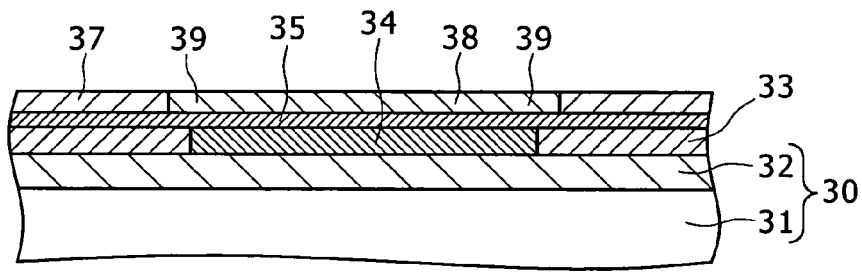
FIG. 6D [STEP 220]
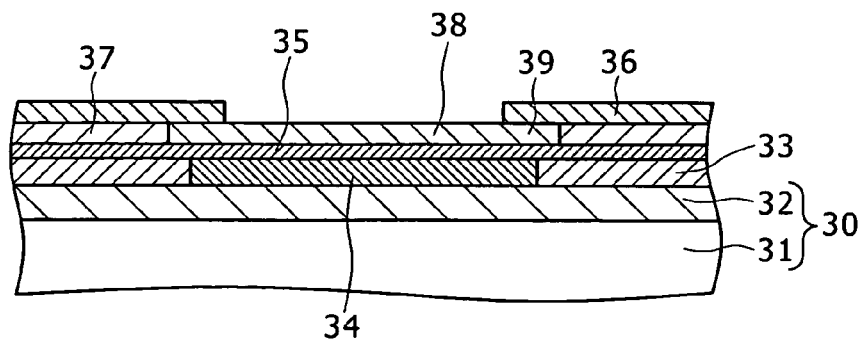

FIG. 7A [STEP 300]
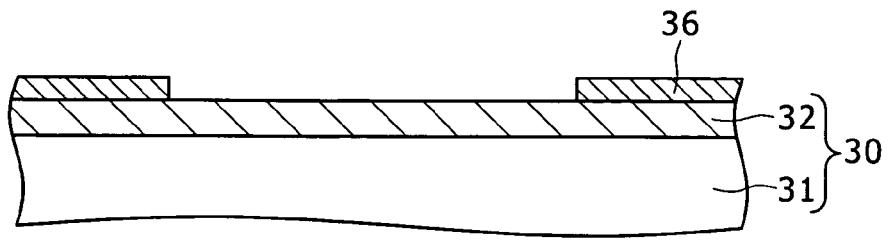
FIG. 7B [STEP 310]
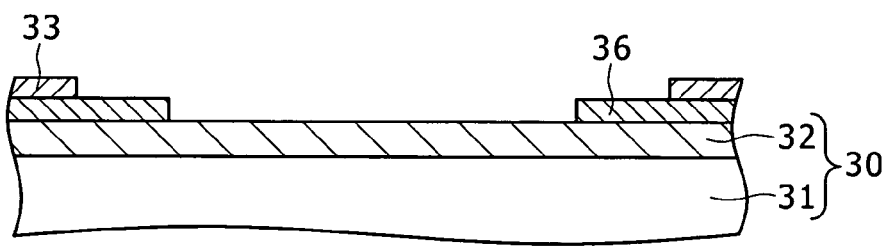
FIG. 7C [STEP 310] (CONTD.)
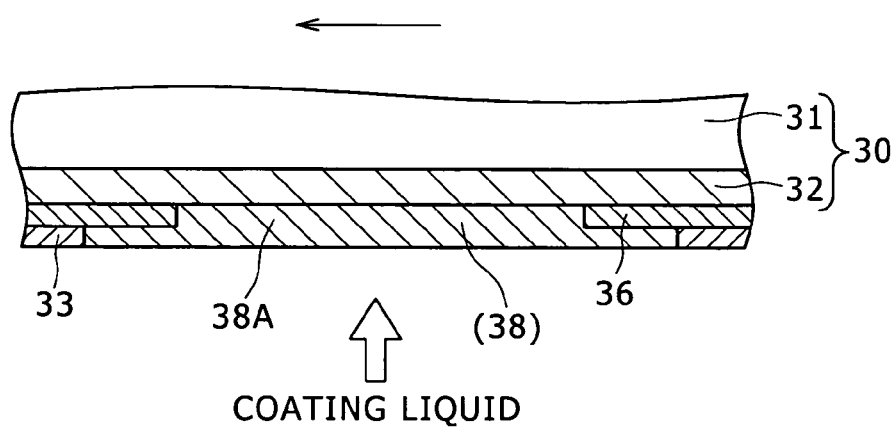
FIG. 7D [STEP 310] (CONTD.)
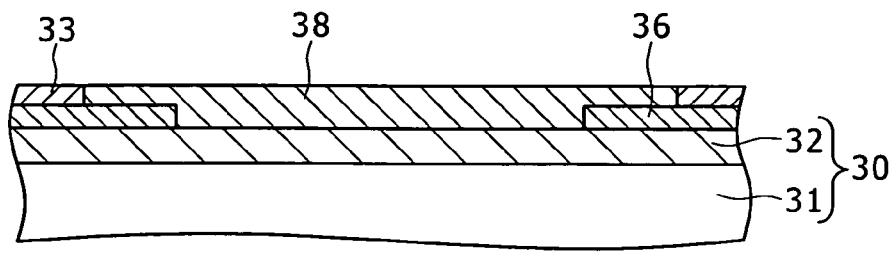

FIG.8A [STEP 320]
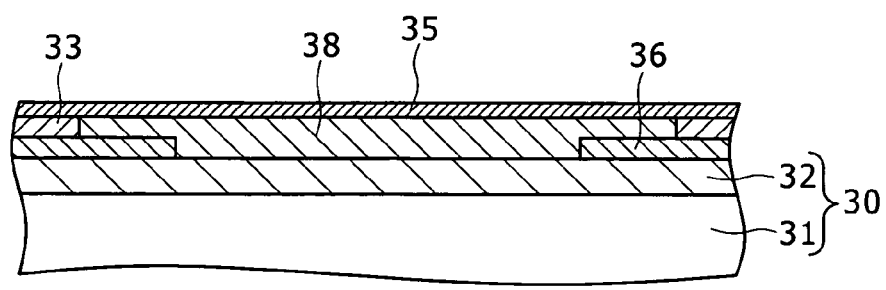
FIG.8B [STEP 330]
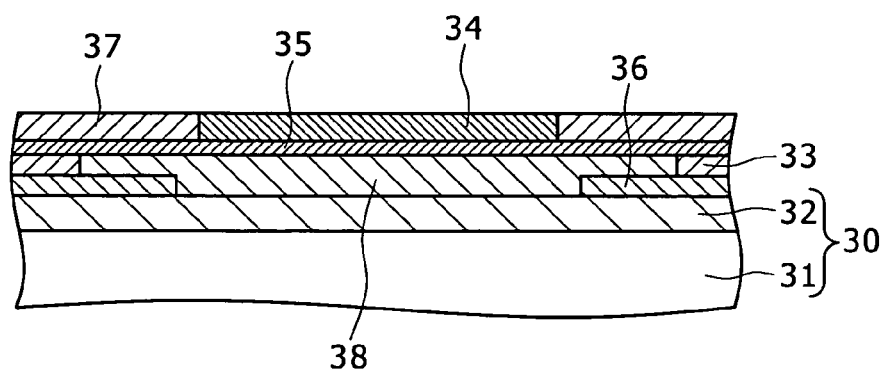

FIG. 9A [STEP 400]
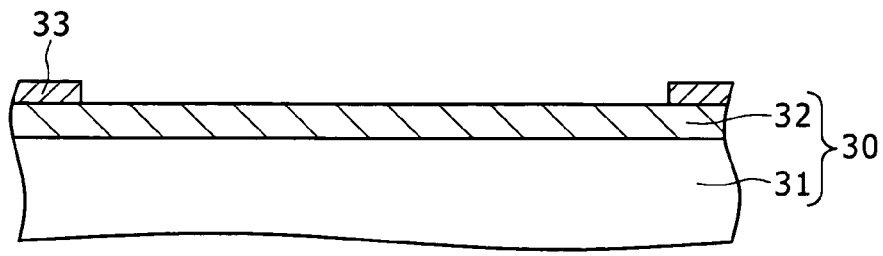
FIG. 9B [STEP 400] (CONTD.)
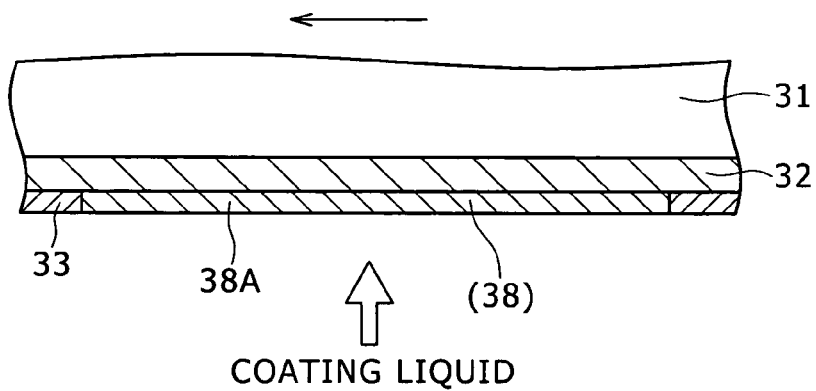
FIG. 9C [STEP 400] (CONTD.)
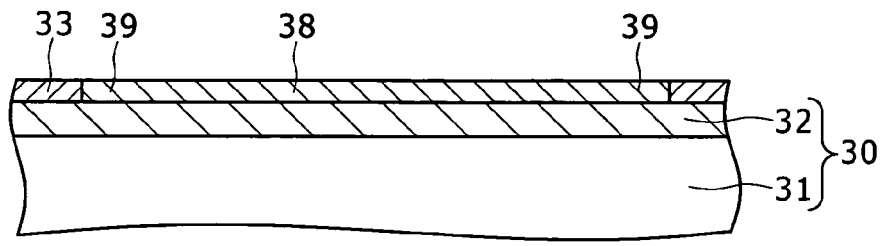
FIG. 9D [STEP 410]
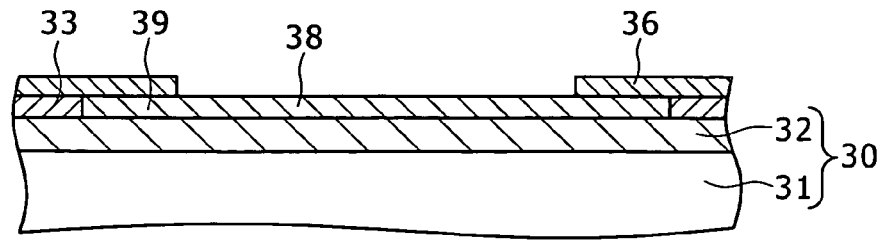

FIG. 10A [STEP 420]
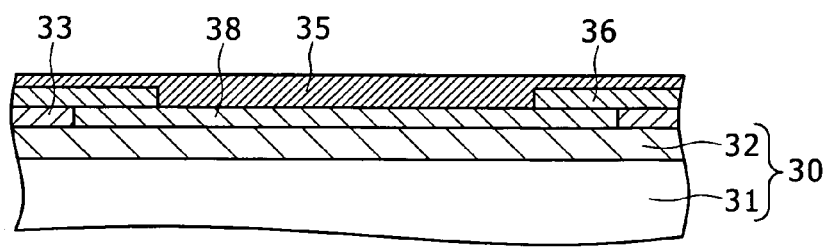
FIG. 10B [STEP 430]
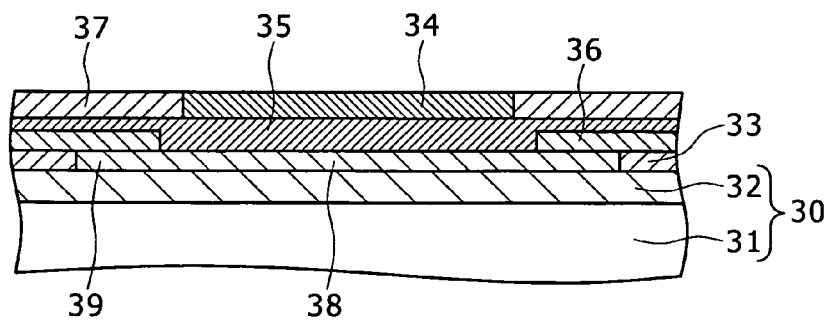

COATING LIQUID

PATTERNING METHOD, METHOD OF MANUFACTURING ORGANIC FIELD EFFECT TRANSISTOR, AND METHOD OF MANUFACTURING FLEXIBLE PRINTED CIRCUIT BOARD

CROSS REFERENCES TO RELATED APPLICATIONS

The present invention is a divisional of U.S. application Ser. No. 11/385,123, filed Mar. 21, 2006, which, in turn, claims priority under 35 U.S.C. §119 to Japanese Patent Application No. JP 2005-083456 filed in the Japanese Patent Office on Mar. 23, 2005, the entire contents of which being incorporated herein by reference.

BACKGROUND OF THE INVENTION

The present invention relates to a patterning method, a method of manufacturing an organic field effect transistor, and a method of manufacturing a flexible printed circuit board.

Field effect transistors (FET) including thin film transistors (Thin Film Transistor; TFT) used in many electronic apparatuses at present each includes, for example, a channel formation region and source/drain regions formed on a silicon semiconductor substrate or a silicon semiconductor layer, a gate insulation layer of $SiO_2$ formed on a surface of the silicon semiconductor substrate or a surface of the silicon semiconductor layer, and a gate electrode provided opposite to the channel formation region through the gate insulation layer. Alternatively, the field effect transistor includes a gate electrode formed on a support, a gate insulation layer formed on the support inclusive of the area on the gate electrode, and a channel formation region and source/drain electrodes which are formed on the gate insulation layer. In the manufacture of the field effect transistors having these structures, very expensive manufacturing apparatuses for manufacturing the semiconductor devices have been used, and there is a keen request for lowering the manufacturing cost.

In view of the above, in recent years, attention has been paid on the research and development of an FET which uses an organic semiconductor material and which can be manufactured based on a method not using a vacuum technology, represented by a printing method, and the performance of the FET has come to be within an inch of the practical use level.

Conventionally, a patterning method in which a pattern composed of a hydrophilic region and a hydrophobic region is formed on a surface of a substrate and patterning is conducted by using this as a printing plate has been well known as offset printing method. Inks used in the offset printing method are usually high in viscosity, but an example of patterning in which low-viscosity liquid materials are used has also been reported.

Besides, Michael L. Chabinyc, et al., "Organic polymeric thin-film transistors fabricated by selective dewetting", APPL. PHYS. Lett 814260-4262 (2002) (hereinafter sometimes referred to as Reference 1) discloses a technology in which a wax is applied to a substrate by printing, an SAM (Self-Assembled Monolayer) is built up on a substrate region not covered with the wax, then the wax is removed, and an organic semiconductor material is built up on the region having been covered with the wax (in this region, the SAM is not formed). The organic semiconductor material is built up by immersing the substrate in a solution of the organic semiconductor material and then pulling up the substrate vertically.

Alternatively, technologies in which a coating liquid containing an organic semiconductor material is applied to a substrate by a die coating method, a dip coating method, or a spin coating method have also been known.

SUMMARY OF THE INVENTION

However, in the technology disclosed in Reference 1 or the above-mentioned coating methods according to the related art, the coating liquid would be present or collected in the region where the coating liquid should intrinsically not be present, under the influence of gravity, so that in some cases it is difficult to obtain the desired pattern. Besides, in the dip coating method, there arises the problem that both sides of the substrate would be wetted with the coating liquid, or the problem that the coating growth speed would be low. The spin coating method involves the problem that most part of the coating liquid would be wasted.

Thus, there is a need to provide a patterning method capable of assuredly solving the problem involved in the coating methods according to the related art, i.e., the problem that the coating liquid would be present or collected in the regions where the coating liquid should intrinsically not be present, under the influence of gravity, with the result of difficulties in obtaining the desired pattern, as well as a method of manufacturing an organic field effect transistor by applying the patterning method, and a method of manufacturing a flexible printed circuit board by applying the patterning method.

In order to fulfill the above-mentioned need, according to an embodiment of the present invention, there is provided a patterning method wherein a nozzle for applying a coating liquid and a substrate are moved relative to each other in the condition where the nozzle is disposed on the lower side of the substrate and a substrate surface controlled in wettability is faced down, so as thereby to apply the coating liquid to a desired region of the substrate, and thereafter the coating liquid is dried so as thereby to obtain a dried coating layer.

In the patterning method of the present invention, preferably, but not limitatively, the substrate is provided with a recess-projection structure having a recessed portion as the desired region and a projected portion so as thereby to control the wettability of the surface of the substrate, and the coating liquid is applied to the recessed portion.

In addition, in the patterning method of the present invention, preferably, the relationship of θ<θ' is satisfied, where θ is the contact angle between the desired region of the substrate and the coating liquid, and θ' is the contact angle between the other region of the substrate than the desired region and the coating liquid. Specifically, in the case where the desired region of the substrate is set to be lyophilic, the other region of the substrate than the desired region is desirably set to be lyophobic or liquid-repellent, or, in the case where the desired region of the substrate is set to be lyophobic, the other region of the substrate than the desired region is desirably set to be liquid-repellent. Here, a lyophilic surface means that the contact angle between the surface and the coating liquid is less than 90 degrees, whereas a lyophobic surface means that the contact angle between the surface and the coating liquid is not less than 90 degrees and less than 110 degrees, and a liquid-repellent surface means that the contact angle between the surface and the coating liquid is not less than 110 degrees. In some cases, the relationship of θ>θ' may be satisfied, though depending on the properties of the substrate and the coating liquid which are used.

While the desired pattern is formed on the substrate in the patterning method of the present invention, in some cases, a method may be adopted in which a pattern composed of the dried coating layer is formed and, thereafter, the pattern is transferred onto a second substrate to thereby provide the second substrate with the desired pattern. Examples of specific methods for transferring the pattern onto the second substrate include a method in which, for example, poly-3-hexylthiophene (P3HP) as an ink is mounted on a projected portion of a stamp having a recess-projection structure (a stamp formed from a fluoro-resin, a stamp produced from a substrate surface-treated with a fluoro-resin, or a stamp treated with 10 mmol of OTS), thereafter the P3HP mounted on the projected surface of the stamp is transferred onto a wholly flat PDMS (silicon rubber), and then the P3HP transferred onto the PDMS is transferred onto the desired second substrate.

According to another embodiment of the present invention, there is provided a method of manufacturing an organic field effect transistor, which is a method of manufacturing a so-called bottom-gate/bottom-contact type organic field effect transistor, including the steps of:

(A) forming a gate electrode on a substrate, (B) thereafter forming a gate insulation layer over the entire surface, (C) then forming source/drain electrodes on the gate insulation layer, and (D) thereafter forming a channel formation region in a portion, between the source/drain electrode and the source/drain electrode, of the gate insulation layer, wherein in the step (D), a nozzle for applying an organic semiconductor material coating liquid and the substrate are moved relative to each other in the condition where the nozzle is disposed on the lower side of the substrate, and the substrate surface provided thereon with the gate insulation layer and the source/drain electrodes and controlled in wettability is faced down, so as thereby to apply the organic semiconductor material coating liquid to the portion, between the source/drain electrode and the source/drain electrode, of the gate insulation layer, and thereafter the organic semiconductor material coating liquid is dried so as thereby to obtain a channel formation region included the organic semiconductor material.

Incidentally, the bottom-gate/bottom-contact type organic field effect transistor thus obtained includes:

(a) a gate electrode formed on a substrate, (b) a gate insulation layer formed on the gate electrode, (c) source/drain electrodes formed on the gate insulation layer, and (d) a channel formation region formed on a portion, between the source/drain electrodes, of the gate insulation layer.

In addition, according to a further embodiment of the present invention, there is provided a method of manufacturing an organic field effect transistor, which is a method of manufacturing a so-called bottom-gate/top-contact type organic field effect transistor, including the steps of:

(A) forming a gate electrode on a substrate, (B) thereafter forming a gate insulation layer on the entire surface, (C) then forming a channel formation region and channel formation region extension portions on the gate insulation layer, and (D) thereafter forming source/drain electrodes on the channel formation region extension portions, wherein in the step (C), a nozzle for applying an organic semiconductor material coating liquid and the substrate are moved relative to each other in the condition where the nozzle is disposed on the lower side of the substrate and the substrate surface provided thereon with the gate insulation layer and controlled in wettability is faced down, so as thereby to apply the organic semiconductor material coating liquid to the gate insulation layer, and thereafter the organic semiconductor material coating liquid is dried so as thereby to obtain the channel formation region and the channel formation region extension portions which are included an organic semiconductor material.

Incidentally, the bottom-gate/top-contact type organic field effect transistor thus obtained includes:

(a) a gate electrode formed on a substrate, (b) a gate insulation layer formed on the gate electrode, (c) a channel formation region and channel formation region extension portions which are formed on the gate insulation layer, and (d) source/drain electrodes formed on the channel formation region extension portions.

Further, according to yet another embodiment of the present invention, there is provided a method of manufacturing an organic field effect transistor, which is a method of manufacturing a so-called top-gate/bottom-contact type organic field effect transistor, including the steps of:

(A) forming source/drain electrodes on a substrate, (B) thereafter forming a channel formation region in a portion, between the source/drain electrode and the source/drain electrode, of the substrate, (C) then forming a gate insulation layer on the entire surface, and (D) thereafter forming a gate electrode on the gate insulation layer, wherein in the step (B), a nozzle for applying an organic semiconductor material coating liquid and the substrate are moved relative to each other in the condition where the substrate surface provided thereon with the source/drain electrodes and controlled in wettability is faced down, so as thereby to apply the organic semiconductor material coating liquid to a portion, between the source/drain electrode and the source/drain electrode, of the substrate, and thereafter the organic semiconductor material coating liquid is dried so as thereby to obtain the channel formation region formed of an organic semiconductor material.

Incidentally, the top-gate/bottom-contact type organic field effect transistor thus obtained includes:

(a) source/drain electrodes formed on a substrate, (b) a channel formation region formed on a portion, between the source/drain electrodes, of the substrate, (c) a gate insulation layer formed on the channel formation region, and (d) a gate electrode formed on the gate insulation layer.

Besides, according to a yet further embodiment of the present invention, there is provided a method of manufacturing an organic field effect transistor, which is a method of manufacturing a so-called top-gate/top-contact type organic field effect transistor, including the steps of:

(A) forming a channel formation region and channel formation region extension portions on a substrate, (B) thereafter forming source/drain electrodes on the channel formation region extension portions, (C) then forming a gate insulation layer over the entire surface, and (D) thereafter forming a gate electrode on the gate insulation layer, wherein in the step (A), a nozzle for applying an organic semiconductor material coating liquid and the substrate are moved relative to each other in the condition where the nozzle is disposed on the lower side of the substrate and a substrate surface controlled in wettability is faced down, so as thereby to apply the organic semiconductor material coating liquid to the substrate, and thereafter the organic semiconductor material coating liquid is dried so as thereby to obtain the channel formation region and the channel formation region extension portions which are formed of an organic semiconductor material.

Incidentally, the top-gate/top-contact type organic field effect transistor thus obtained includes:

(a) a channel formation region and channel formation region extension portions which are formed on a substrate, (b) source/drain electrodes formed on the channel formation region extension portions, (c) a gate insulation layer formed on the source/drain electrodes and the channel formation region, and (d) a gate electrode formed on the gate insulation layer.

According to still another embodiment of the present invention, there is provided a method of manufacturing a flexible printed circuit board, wherein a nozzle for applying a conductive material coating liquid and a substrate are moved relative to each other in the condition where the nozzle is disposed on the lower side of the substrate and a substrate surface controlled in wettability is faced down, so as thereby to apply the conductive material coating liquid to the substrate, and thereafter the conductive material coating liquid is dried so as thereby to obtain a circuit pattern composed of a conductive material coating layer.

As a coating apparatus including a nozzle for use in the patterning method, the method of manufacturing an organic field effect transistor or the method of manufacturing a flexible printed circuit board according to the present invention (hereinafter, these methods will in some cases be generically referred to simply as the present invention), there may be mentioned the so-called capillary coater. The relative movement between the nozzle and the substrate may be achieved by moving the substrate while the nozzle is fixed, or by moving the nozzle while the substrate is fixed, or by moving both the nozzle and the substrate.

As the coating liquid in the patterning method of the present invention, there may be mentioned coating liquids which are each prepared by dissolving an organic semiconductor material in a solvent. Specific examples of the combination of [organic semiconductor material, solvent] include [poly-3-hexylthiophene, toluene], [poly-3-hexylthiophene, chloroform], [poly-3-hexylthiophene, xylene], [poly-3-hexylthiophene, tetrahydrofuran (THF)], and [poly-3-hexylthiophene, chlorobenzene].

Alternatively, as the coating liquid in the patterning method of the present invention, there may be mentioned coating liquids which are each prepared by dissolving a conductive material in a solvent. Specific examples of the combination of [conductive material, solvent] include [poly(3,4-ethylenedioxythiophene)/polystyrenesulfonic acid [PEDOT/PSS], water], [PEDOT/PSS, mixed liquid of isopropyl alcohol and water], [PEDOT/PSS, mixed liquid of water and surfactant], [PEDOT/PSS, mixed liquid of water and ethylene glycol], [silver nano-particles, ethyl acetate], [silver nano-particles, water], [silver nano-particles, toluene], [gold nano-particles, toluene], [gold nano-particles, chloroform], and [gold nano-particles, hexane].

Or, as the coating liquid in the patterning method of the present invention, there may be mentioned coating liquids which are each prepared by dissolving an organic EL material in a solvent. Specific examples of the combination of [organic EL material, solvent] include [MEH-PPV, chlorobenzene].

In addition, as the organic semiconductor material coating liquid in the methods of manufacturing an organic field effect transistor according to the another embodiment, the further embodiment, the yet another embodiment and the yet further embodiment of the present invention (hereinafter, these methods will in some cases be generically referred to simply as the method of manufacturing an organic field effect transistor according to the present invention), there may be mentioned coating liquids which are each prepared by dissolving an organic semiconductor material in a solvent. Specific examples of the combination of [organic semiconductor material, solvent] include the same combinations as the above-mentioned combinations of [organic semiconductor material, solvent] in the patterning method of the present invention.

Further, as the conductive material coating liquid in the method of manufacturing a flexible printed circuit board according to the present invention, there may be mentioned coating liquids which are each prepared by dissolving a conductive material in a solvent. Specific examples of the combination of [conductive material, solvent] include the same combinations as the above-mentioned combinations of [conductive material, solvent] in the pattering method of the present invention.

In order to obtain the substrate surface controlled in wettability in the pattering method of the present invention or the method of manufacturing a flexible circuit board according to the present invention, it suffices, for example, to treat the surface of the desired region of the substrate or to treat the surface of the other region of the substrate than the desired region so that the relationship of $\theta < \theta'$ is satisfied, where $\theta$ is the contact angle between the desired region of the substrate and the coating liquid, and $\theta'$ is the contact angle between the other region of the substrate than the desired region and the coating liquid. As such a treatment, for example, a method of covering the other region of the substrate than the desired region with a material showing a large angle of contact with the coating liquid. Examples of such a material include octadecyltrimethoxysilane (OTS) and hexamethylenedisilazane (HMDS). Another method which can be adopted is a method wherein the surface of the desired region of the substrate is made to be lyophilic by treatment with aminotrichlorosilane, and the other region of the substrate than the desired region is made to be liquid-repellent by treatment with perfluorooctyltrichlorosilane. Further methods which can be adopted include a method wherein the surface of the substrate is made to be lyophilic by an oxygen plasma treatment, and a method wherein toner particles are transferred and fixed onto the surface of the substrate by use of a dry indirect electrostatic copying machine so as to form a liquid-repellent region or lyophobic region composed of the toner particles on the surface of the substrate.

In addition, in order to obtain the substrate surface provided thereon with the gate insulation layer and the source/drain electrodes and controlled in wettability in the method of manufacturing an organic field effect transistor according to the another embodiment of the present invention, for example, a method may be adopted in which the other region than the region to which the organic semiconductor material coating liquid is to be applied, of the surface provided thereon with the gate insulation layer and the source/drain electrodes, is covered with a material showing a large angle of contact with the coating liquid. Besides, in order to obtain the substrate surface provided thereon with the gate insulation layer and controlled in wettability in the method of manufacturing an organic field effect transistor according to the further embodiment of the present invention, for example, a method may be adopted in which the other region than the region to which the organic semiconductor material coating liquid is to be applied, of the surface provided thereon with the gate insulation layer, is covered with a material showing a large angle of contact with the coating liquid. Further, in order to obtain the substrate surface provided thereon with the source/drain electrodes and controlled in wettability in the method of manufacturing an organic field effect transistor according to the yet another embodiment of the present invention, for example, a method may be adopted in which the other region than the region to which the organic semiconductor material coating liquid is to be applied, of the surface provided thereon with the source/drain electrodes, is covered with a material showing a large angle of contact with the coating liquid. In addition, in order to obtain the substrate surface controlled in wettability in the method of manufacturing an organic field effect transistor according to the yet further embodiment of the present invention, for example, a method may be adopted in which the other region than the region to which the organic semiconductor material coating liquid is to be applied, of the relevant substrate surface, is covered with a material showing a large angle of contact with the coating liquid. Here, examples of the relevant material include octadecyltrimethoxysilane (OTS), and perfluorooctyltrichlorosilane.

In the method of manufacturing an organic field effect transistor according to the present invention, examples of the material constituting the gate insulation layer include not only inorganic insulating materials such as silicon oxide based materials, silicon nitride ($SiN_Y$) $Al_2O_3$, and metal oxide highly dielectric insulating materials but also organic insulating materials such as polymethyl methacrylate (PMMA), polyvinyl phenol (PVP), polyethylene terephthalate (PET), polyoxymethylene (POM), polyvinyl chloride, polyvinylidene fluoride, polysulfone, polycarbonate (PC), and polyimides, and combinations of these materials. Incidentally, examples of the silicon oxide based materials include silicon dioxide ($SiO_2$), BPSG, PSG, BSG, AsSG, PbSG, silicon oxynitride (SiON), SOG (Spin On Glass), and low-dielectric-constant $SiO_X$ based materials (e.g., polyaryl ethers, cycloperfluorocarbon polymers, and benzocyclobutene, cyclic fluoro-resins, polytetrafluoroethylene, aryl ether fluorides, polyimide fluorides, amorphous carbon, organic SOG).

Examples of the method for forming the gate insulation layer include various printing methods such as screen printing method, ink jet printing method, offset printing method, gravure printing method, etc.; various coating methods such as air doctor coater method, blade coater method, rod coater method, knife coater method, squeeze coater method, reverse roll coater method, transfer roll coater method, gravure coater method, kiss coater method, cast coater method, spray coater method, slit orifice coater method, calender coater method, etc.; various CVD methods; dip method; casting method; spin coat method; spray method; and various PVD methods. Here, examples of the PVD methods include (a) various vacuum evaporation methods such as electron beam heating method, resistance heating method, flash evaporation method, etc., (b) plasma vapor deposition methods, (c) various sputtering methods such as two-pole sputtering method, DC (direct current) sputtering method, DC magnetron sputtering method, RF sputtering method, magnetron sputtering method, ion beam sputtering method, bias sputtering method, etc., and (d) various ion plating methods such as DC method, RF method, multi-cathode method, activation reaction method, electric field vapor deposition method, high-frequency ion plating method, reactive ion plating method, etc.

Alternatively, the gate insulation layer can be formed by oxidizing or nitriding the surface of the gate electrode, or by forming an oxide film or nitride film at the surface of the gate electrode. Examples of the method for oxidizing the surface of the gate electrode, though depending on the material constituting the gate electrode, include a thermal oxidation method, an oxidizing method using an $O_2$ plasma, and an anodic oxidation method. Examples of the method for nitriding the surface of the gate electrode, though depending on the material constituting the gate electrode, include a nitriding method using an $N_2$ plasma. Or, alternatively, in the case where the gate electrode is constituted of gold (Au), for example, the gate insulation layer can be formed at the surface of the gate electrode by self-organizingly covering the gate electrode surface with insulating molecules having a functional group capable of forming a chemical bond with the gate electrode, such as a straight chain hydrocarbon modified with a mercapto group at one end thereof, while using such a method as dipping method.

Or, the gate insulation layer can be formed by application of the patterning method according to the present invention.

Further, in the organic field effect transistor according to the present invention, examples of the material constituting the gate electrode, the source/drain electrodes and various wirings include metals such as platinum (Pt), gold (Au), palladium (Pd), chromium (Cr), nickel (Ni), molybdenum (Mo), niobium (Nb), neodymium (Nd), aluminum (Al), silver (Ag), tantalum (Ta), tungsten (W), copper (Cu), rubidium (Rb), rhodium (Rh), titanium (Ti), indium (In), tin (Sn), etc., alloys containing any of these metallic elements, conductive particles of these metals, conductive particles of alloys containing any of these metals, polysilicon, amorphous silicon, tin oxide, indium oxide, indium tin oxide (ITO), and laminate structures of layers containing any of these elements.

Examples of the method for forming the source/drain electrodes and the gate electrode, though depending on the materials constituting these electrodes, include spin coating method; the above-mentioned various printing methods using any of various conductive pastes and various conductive polymer solutions; the above-mentioned various coating methods; lift-off method; shadow mask method; plating methods such as electroplating method, electroless plating method, and combination of these; spraying method; the above-mentioned various PVD methods; and various CVD methods including MOCVD method; which may further be combined with patterning technology, as required.

Furthermore, examples of the materials for forming the gate electrode and the source/drain electrodes include such organic materials as PEDOT/PSS. In this case, the gate electrode can be formed further by application of the patterning method according to the present invention.

In the patterning method according to the present invention or the method of manufacturing an organic field effect transistor according to the present invention, examples of the substrate or the second substrate include various glass substrates, various glass substrates provided with an insulation layer on the surface thereof, quartz substrate, quartz substrate provided with an insulation layer on the surface thereof, and silicon substrate provided with an insulation layer on the surface thereof. Further examples of the substrate or the second substrate in the pattering method according to the present invention or the method of manufacturing an organic field effect transistor according to the present invention include plastic films, plastic sheets and plastic substrates formed of a polymer material such as polyether sulfone (PES), polyimides, polycarbonate (PC), polyethylene terephthalate (PET), polymethyl methacrylate (PMMA), polyvinyl alcohol (PVA), and polyvinyl phenol (PVP); when the substrate or second substrate constituted of such a flexible polymer material is used, it is possible to incorporate or integrate the organic field effect transistor into or with, for example, displays or electronic apparatus having a curved surface. Yet further examples of the substrate or the second substrate include conductive substrates (substrates formed of a metal, such as gold, or highly oriented graphite). Besides, in the method of manufacturing an organic field effect transistor according to the present invention, the organic field effect transistor may in some cases be provided on a support member, depending on the configuration or structure of the organic field effect transistor; in such a case, the support member may be composed of any of the above-mentioned materials. In addition, examples of the substrate or the second substrate in the method of manufacturing a flexible printed circuit board according to the present invention include flexible plastic films composed of polymer materials such as polyether sulfone (PES), polyimides, polycarbonate (PC), polyethylene terephthalate (PET), polymethyl methacrylate (PMMA), polyvinyl alcohol (PVA), and polyvinyl phenol (PVP).

In the case where the organic field effect transistor obtained by the method of manufacturing an organic field effect transistor according to the present invention is applied to or used in displays or various electronic apparatuses, a multiplicity of the organic field effect transistors may be integrated on a substrate to obtain a monolithic integrated circuit, or the respective organic field effect transistors may be cut off individually to be used as discrete component parts. In addition, the organic field effect transistor may be potted with a resin.

In the present invention, the nozzle for applying a coating liquid or the like and a substrate or the like are moved relative to each other in the condition where the nozzle is disposed on the lower side of the substrate or the like and the surface of the substrate or the like controlled in wettability is faced down, so as thereby to apply the coating liquid or the like to a desired region of the substrate or the like. Therefore, it is possible to assuredly solve the problem involved in the conventional coating method, i.e., the problem that the coating liquid or the like would be present or collected on the region where the coating liquid should intrinsically not be present, under the influence of gravity. Then, it is possible to apply the coating liquid or the like to a large-area substrate or the like comparatively easily and with high accuracy, and wasting of the coating liquid or the like can be avoided. Further, it is possible to use a low-viscosity coating liquid, and to contrive enhancement of the accuracy in forming a pattern or the like.

BRIEF DESCRIPTION OF THE DRAWINGS

FIGS. 4A to 4D are schematic partly sectional diagrams of a substrate or the like for illustrating a patterning method in Embodiment 1 and a method of manufacturing an organic field effect transistor in Embodiment 1;

FIGS. 5A to 5D are schematic partly sectional diagrams of the substrate or the like for illustrating the patterning method in Embodiment 1 and the method of manufacturing an organic field effect transistor in Embodiment 1, subsequent to the instance of FIG. 4D;

FIGS. 6A to 6D are schematic partly sectional diagrams of a substrate or the like for illustrating a patterning method in Embodiment 2 and a method of manufacturing an organic field effect transistor in Embodiment 2;

FIGS. 7A to 7D are schematic partly sectional diagrams of a substrate or the like for illustrating a pattering method in Embodiment 3 and a method of manufacturing an organic field effect transistor in Embodiment 3;

FIGS. 8A and 8B are schematic partly sectional diagrams of the substrate or the like for illustrating the patterning method in Embodiment 3 and the method of manufacturing an organic field effect transistor in Embodiment 3, subsequent to the instance of FIG. 7D;

FIGS. 9A to 9D are schematic partly sectional diagrams of a substrate or the like for illustrating a patterning method in Embodiment 4 and a method of manufacturing an organic field effect in Embodiment 4;

FIGS. 10A and 10B are schematic partly sectional diagrams of the substrate or the like for illustrating the patterning method in Embodiment 4 and the method of manufacturing an organic field effect in Embodiment 4, subsequent to the instance of FIG. 9D;

DETAILED DESCRIPTION OF THE PREFERRED EMBODIMENTS

Figure 1A:
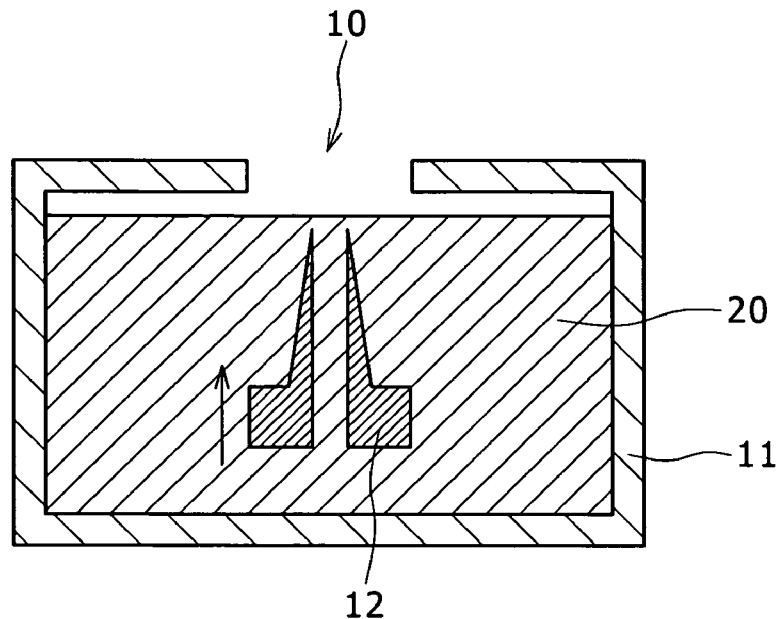
FIGS. 1A and 1B are diagrams showing the outline of a capillary coater, and schematically illustrate the condition where a coating liquid is being applied to a substrate by use of the capillary coater.
Figure 1B:
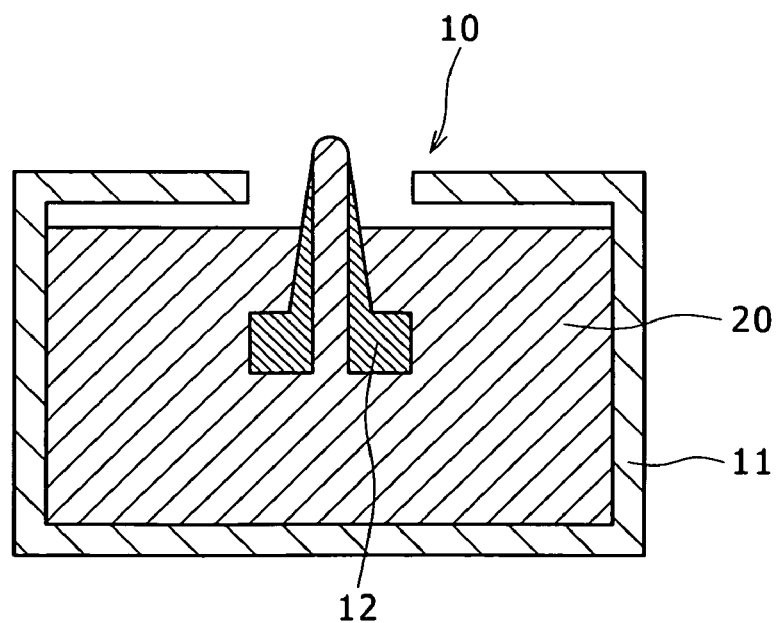

Now, the present invention will be described below based on embodiments thereof, referring to the drawings. First, the outline of a capillary coater suited for carrying out an embodiment of the present invention will be described referring to FIGS. 1A and 1B, FIGS. 2A and 2B, and FIGS. 3A and 3B.

As a conceptual diagram is shown in FIG. 1A, the capillary coater 10 includes a tank 11 for reserving a coating liquid 20, and a nozzle 12 disposed inside the tank 11 and moved up and down by a lift (not shown). A tip end portion of the nozzle 12 is provided with a slit; as shown in the conceptual diagram in FIG. 1B, when the nozzle 12 is located at an elevated position by operating the lift (not shown), the coating liquid 20 protrudes from the slit in the tip end portion of the nozzle 12 by capillarity. Incidentally, the slit extends in the direction perpendicular to the paper surface of the drawing.

Figure 2A:
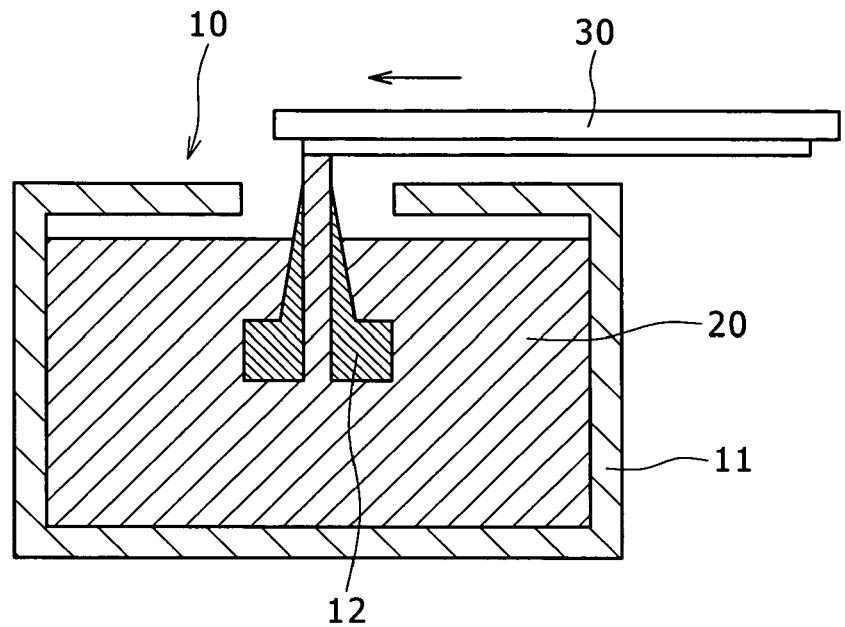
FIGS. 2A and 2B are diagrams showing the outline of the capillary coater, and schematically illustrate the condition where the coating liquid is being applied to the substrate by use of the capillary coater, subsequent to the instance of FIG. 1B.
Figure 2B:
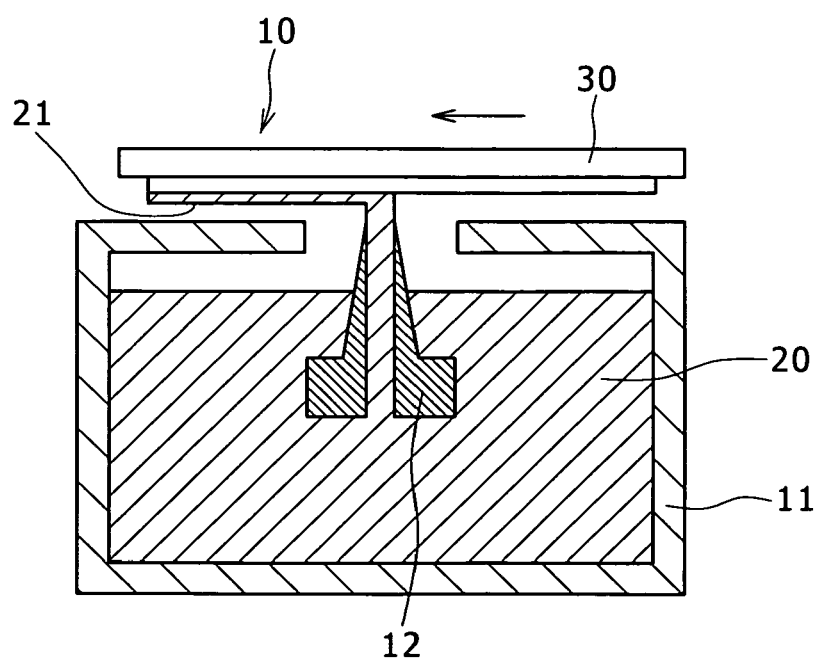
Figure 3A:
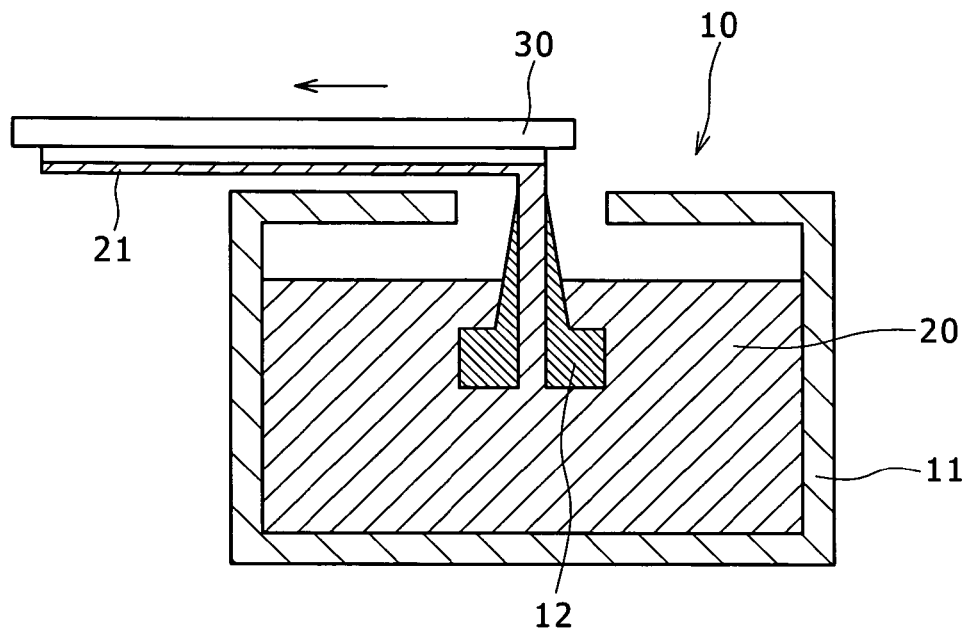
FIGS. 3A and 3B are diagrams showing the outline of the capillary coater, and schematically illustrate the condition where the coating liquid is being applied to the substrate by use of the capillary coater, subsequent to the instance of FIG. 2B.
Figure 3B:
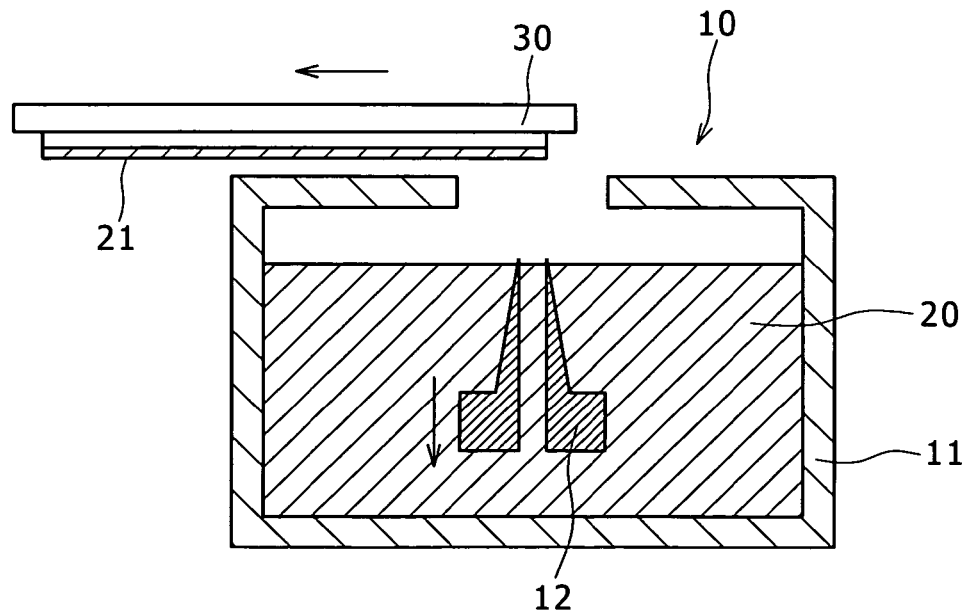

In the condition as a conceptual diagram is shown in FIG. 2A, a substrate 30 is moved from the right side toward the left side in the drawing by a moving device (not shown), whereon the coating liquid 20 protruding from the slit in the tip end portion of the nozzle 12 by capillarity is applied to the substrate 30, as a conceptual diagram is shown in FIG. 2B. The distance (gap) between the tip end portion of the nozzle 12 and the substrate 30 is kept at 0.2 mm, for example, and the moving velocity of the substrate is set at 0.7 m/min. Incidentally, the coating liquid applied to the substrate 30 is indicated as a coating liquid 21. Simultaneously, the coating liquid 20 in the tank 11 is continually supplied to the slit in the tip end portion of the nozzle 12 by capillarity. When the application of the coating liquid 20 to the substrate 30 is completed (see a conceptual diagram shown in FIG. 3A), the nozzle 12 is located at a lowered position by an operation of the lift (not shown) (see a conceptual diagram shown in FIG. 3B). In this manner, the application of the coating liquid to a desired region of the single substrate is completed.

Embodiment 1

Embodiment 1 relates to the pattering method according to the one embodiment of the present invention and the method of manufacturing an organic field effect transistor according to the another embodiment of the present invention. Now, referring to FIGS. 4A to 4D and FIGS. 5A to 5D which are schematic partly end elevation diagrams of a substrate or the like, the pattering method according to Embodiment 1 and the method of manufacturing an organic field effect transistor according to Embodiment 1 will be described below. Incidentally, in Embodiment 1, the pattering method is applied to the formation of a gate electrode of the organic field effect transistor and to the formation of a channel formation region.

Besides, in Embodiment 1 or in Embodiments 2 to 4 which will be described later, the channel formation region 38 is formed on the basis of a toluene solution of poly-3-hexylthiophene (P3HP), and the gate electrode 34 is formed on the basis of an aqueous solution of PEDOT/PSS. Here, the contact angles θ and θ' of these solutions are shown in Table 1 below. In Table 1, "OTS" means octadecyltrimethoxysilane, and the concentration thereof is 1 mmol.

TABLE 1

| Liquid | Solid | Contact angle |
| --- | --- | --- |
| Toluene solution of P3HP | $SiO_2$ | θ = ca. 30° or below |
| Toluene solution of P3HP | Au | θ = ca. 30° or below |
| Toluene solution of P3HP | OTS | θ' = ca. 40° |
| Aqueous solution of PEDOT/PSS | $SiO_2$ | θ = ca. 34° |
| Aqueous solution of PEDOT/PSS | OTS | θ' = ca. 110° |

[Step 100]

First, the gate electrode 34 is formed on the substrate 30 prepared by forming an insulation film 32 of $SiO_2$ on a surface of the glass substrate 31. Specifically, a coating layer 33 composed of octadecyltrimethoxysilane (OTS) from which the portion to be provided with the gate electrode 34 has been removed is formed on the insulation film 32 by a PDMS stamp method, for example. This condition is shown in the schematic partly end elevation diagram of FIG. 4A.

Next, the patterning method according to the present invention is applied. Specifically, in the condition where a nozzle 12 for applying an aqueous PEDOT/PSS solution as the coating liquid is disposed on the lower side of the substrate (see FIGS. 1A, 1B, and 2A) and the surface of the substrate 30 controlled in wettability (namely, the surface of the substrate 30 provided with the coating layer 33) is faced down, the nozzle 12 and the substrate 30 are moved relative to each other (see FIGS. 2A, 2B, and 3A), whereby the coating liquid 34A is applied to the desired region (specifically, the region of the insulation film 32 where the gate electrode 34 is to be formed) of the substrate 30. This condition is shown in the schematic partly end elevation of FIG. 4B. Thereafter, the coating liquid 34A is dried, whereby a pattern composed of the dried coating layer, i.e., the gate electrode 34 formed of PEDOT/PSS can be obtained (see the schematic partly end elevation diagram of FIG. 4C).

[Step 110]

Next, a gate insulation layer 35 is formed over the entire surface. Specifically, the gate insulation layer 35 of $SiO_2$ is formed on the entire surface (specifically, on the gate electrode 34 and the coating layer 33) based on a sputtering method (see the schematic partly end elevation diagram of FIG. 4D). At the time of forming the gate insulation layer 35, a part of the gate electrode 34 is covered with a hard mask, whereby a take-out portion (not shown) of the gate electrode 34 can be formed without any photolithographic process.

[Step 120]

Thereafter, source/drain electrodes 36 are formed on the gate insulation layer 35. Specifically, a titanium (Ti) layer (not shown) as a close contact layer and a gold (Au) layer as the source/drain electrodes 36 are sequentially formed on the basis of a vacuum evaporation method. In this manner, the structure as shown in FIG. 5A can be obtained. At the time of forming the close contact layer and the source/drain electrodes 36, the region where the channel formation region 38 is to be formed is covered with a hard mask, whereby the source/drain electrodes 36 can be formed without any photolithographic process.

[Step 130]

Next, the channel formation region 38 is formed on the portion, between the source/drain electrode 36 and the source/drain electrode 36, of the gate insulation layer 35.

For this purpose, first, a coating layer 37 composed of octadecyltrimethoxysilane (OTS) from which the portion where the channel formation region 38 is to be formed has been removed is formed by a PDMS stamp method, for example. This condition is shown in the schematic partly end elevation diagram of FIG. 5B.

Then, in the condition where the nozzle 12 for applying an organic semiconductor material coating liquid composed of a toluene solution of P3HP (5 g/l) is disposed on the lower side of the substrate 30 (see FIGS. 1A, 1B, and 2A) and substrate surface provided thereon with the gate insulation layer 35 and the source/drain electrode 36 and controlled in wettability (namely, the surface of the substrate provided thereon with the coating layer 37) is faced down, the nozzle 12 and the substrate 30 are moved relative to each other (see FIGS. 2A, 2B, and 3A), whereby the organic semiconductor material coating liquid 38A is applied to the portion, between the source/drain electrode 36 and the source/drain electrode 36, of the gate insulation layer 35. This condition is shown in the schematic partly end elevation diagram of FIG. 5C. Thereafter, the organic semiconductor material coating liquid 38A is dried, whereby the channel formation region 38 composed of P3HP which is an organic semiconductor material can be obtained (see the schematic partly end elevation diagram of FIG. 5D).

Or, in other words, in the condition where the nozzle 12 for applying the toluene solution of P3HP as the coating liquid is disposed on the lower side of the substrate 30 (see FIGS. 1A, 1B, and 2A) and the surface of the substrate 30 controlled in wettability (namely, the surface of the substrate 30 provided thereon with the coating layer 37) is faced down, the nozzle 12 and the substrate 30 are moved relative to each other (see FIGS. 2A, 2B, and 3A), whereby the coating liquid 38A is applied to the desired region (specifically, the region of the gate insulation layer 35 where the channel formation region 38 is to be formed) of the substrate 30 (see the schematic partly end elevation diagram of FIG. 5C). Thereafter, the coating liquid 38A is dried, whereby a pattern composed of the dried coating layer, i.e., the channel formation region 38 composed of P3HP can be obtained (see the schematic partly end elevation diagram of FIG. 5D).

[Step 140]

Finally, an insulation layer (not shown) as a passivation film is formed on the entire surface, the insulation layer on the upper side of the source/drain electrodes 36 is provided with openings, a wiring material layer is formed on the entire surface inclusive of the inside of the openings, and thereafter the wiring material layer is patterned, whereby a bottom-gate/bottom-contact type organic field effect transistor in which wirings (not shown) connected to the source/drain electrodes 36 are formed on the insulation layer can be obtained.

Specifically, the bottom-gate/bottom-contact type organic field effect transistor includes:

(a) the gate electrode 34 formed on the substrate 30, (b) the gate insulation layer 35 formed on the gate electrode 34, (c) the source/drain electrodes 36 formed on the gate insulation layer 35, and (d) the channel formation region 38 formed on the portion, between the source/drain electrodes 36, of the gate insulation layer 35.

Embodiment 2

Embodiment 2 relates to the patterning method according to the one embodiment of the present invention and the method of manufacturing an organic field effect transistor according to the further embodiment of the present invention. Now, the patterning method in Embodiment 2 and the method of manufacturing an organic field effect transistor in Embodiment 2 will be described below referring to FIGS. 6A to 6D which are schematic partly end elevation diagrams of a substrate or the like. In Embodiment 2, also, the patterning method is applied to the formation of a gate transistor and the formation of a channel formation region, in the organic field effect transistor.

[Step 200]

First, the same step as [Step 100] in Embodiment 1 is carried out to form the gate electrode 34 on the substrate 30, and thereafter the same step as [Step 110] in Embodiment 1 is carried out to form a gate insulation layer 35 on the entire surface.

[Step 210]

Next, a channel formation region 38 and channel formation region extension portions 39 are formed on the gate insulation layer 35. Specifically, the same step as [Step 130] in Embodiment 1 is carried out. To be more specific, a coating layer 37 composed of octadecyltrimethoxysilane (OTS) from which the portions where the channel formation region 38 and the channel formation region extension portions 39 are to be formed have been removed is formed by a PDMS stamp method, for example. This condition is shown in the schematic partly end elevation diagram of FIG. 6A.

Then, in the condition where a nozzle 12 for applying an organic semiconductor material coating liquid consisting of a toluene solution of P3HP (5 g/l) is disposed on the lower side of the substrate 30 (see FIGS. 1A, 1B, and 2A) and the surface of the substrate 30 provided thereon with the gate insulation layer 35 and controlled in wettability (namely, the surface of the substrate 30 provided thereon with the coating layer 37) is faced down, the nozzle 12 and the substrate 30 are moved relative to each other (see FIGS. 2A, 2B, and 3A), whereby the organic semiconductor material coating liquid 38A is applied to the gate insulation layer 35. This condition is shown in the schematic partly end elevation diagram of FIG. 6B. Thereafter, the organic semiconductor material coating liquid 38A is dried, whereby the channel formation region 38 composed of P3HP which is an organic semiconductor material can be obtained (see the schematic partly end elevation diagram in FIG. 6C).

Or, in other words, in the condition where the nozzle for applying the toluene solution of the P3HP as the coating liquid is disposed on the lower side of the substrate 30 (see FIGS. 1A, 1B, and 2A) and the surface of the substrate 30 controlled in wettability (namely, the surface of the substrate 30 provided thereon with the coating layer 37) is faced down, the nozzle 12 and the substrate 30 are moved relative to each other (see FIGS. 2A, 2B, and 3A), whereby the coating liquid 38A is applied to the desired region (specifically, the region of the gate insulation layer 35 where the channel formation region 38 is to be formed) of the substrate 30 (see the schematic partly end elevation diagram of FIG. 6B). Thereafter, the coating liquid 38A is dried, whereby a pattern composed of a dried coating layer, i.e., the channel formation region 38 formed of P3HP can be obtained (see the schematic partly end elevation diagram in FIG. 6C).

[Step 220]

Thereafter, the same step as [Step 120] in Embodiment 1 is carried out, to form source/drain electrodes 36 on the channel formation region extension portions 39. Specifically, a titanium (Ti) layer (not shown) as a close contact layer and a gold (Au) layer as the source/drain electrodes 36 are sequentially formed on the basis of a vacuum evaporation method. In this manner, the structure as shown in FIG. 6D can be obtained. At the time of forming the close contact layer and the source/drain electrodes 36, the channel formation region 38 is covered with a hard mask, whereby the source/drain electrodes 36 can be formed without any photolithographic process.

[Step 230]

Finally, the same step as [Step 140] in Embodiment 1 is carried out, whereby a bottom-gate/top-contact type organic field effect transistor can be obtained.

Specifically, the bottom-gate/top-contact type organic field effect transistor includes:

(a) the gate electrode 34 formed on the substrate 30, (b) the gate insulation layer 35 formed on the gate electrode 34, (c) the channel formation region 38 and the channel formation region extension portions 39 which are formed on the gate insulation layer 35, and (d) the source/drain electrodes 36 formed on the channel formation region extension portions 39.

Embodiment 3

Embodiment 3 relates to the patterning method according to the one embodiment of the present invention and the method of manufacturing an organic field effect transistor according to the yet another embodiment of the present invention. Now, the patterning method in Embodiment 3 and the method of manufacturing an organic field effect transistor in Embodiment 3 will be described below referring to FIGS. 7A to 7D and FIGS. 8A and 8B which are schematic partly end elevation diagrams of a substrate or the like. In Embodiment, also, the patterning method is applied to the formation of a gate electrode and the formation of a channel formation region, in the organic field effect type transistor.

[Step 300]

First, source/drain electrodes 36 are formed on the substrate 30 prepared by forming an insulation film 32 of $SiO_2$ on a surface of a glass substrate 31, by a lift-off method, for example. Specifically, a resist layer from which the portions to be provided with the source/drain electrodes 36 have been removed is formed on the insulation film 32 on the basis of a photolithographic technique, then a titanium (Ti) layer (not shown) as a close contact layer and a gold (Au) layer as the source/drain electrodes 36 are sequentially formed on the basis of a vacuum evaporation method, and thereafter the resist layer is removed. In this manner, the structure shown in FIG. 7A can be obtained.

[Step 310]

Next, a channel formation region 38 is formed on a portion, between the source/drain electrode 36 and the source/drain electrode 36, of the substrate 30 (more specifically, the insulation film 32).

For this purpose, first, a coating layer 33 composed of octadecyltrimethoxysilane (OTS) from which the portion to be provided with the channel formation portion 38 has been removed is formed by a PDMS stamp method, for example. This condition is shown in the schematic partly end elevation diagram in FIG. 7B.

Then, in the condition where a nozzle 12 for applying an organic semiconductor material coating liquid composed of a toluene solution of P3HP (5 g/l) is disposed on the lower side of the substrate 30 (see FIGS. 1A, 1B, and 2A) and the surface of the substrate 30 provided thereon with the source/drain electrodes 36 and controlled in wettability (namely, the surface of the substrate 30 provided thereon with the coating layer 33) is faced down, the nozzle 12 and the substrate 30 are moved relative to each other (see FIGS. 2A, 2B, and 3A), whereby the organic semiconductor material coating liquid 38A is applied to the portion, between the source/drain electrode 36 and the source/drain electrode 36, of the substrate 30. This condition is shown in the schematic partly end elevation diagram of FIG. 7C. Thereafter, the organic semiconductor material coating liquid 38A is dried, whereby the channel formation region 38 composed of P3HP which is an organic semiconductor material can be obtained (see the schematic partly end elevation diagram in FIG. 7D).

Or, in other words, in the condition where the nozzle 12 for applying the toluene solution of P3HP as the coating liquid is disposed on the lower side of the substrate 30 (see FIGS. 1A, 1B, and 2A) and the surface of the substrate 30 controlled in wettability (namely, the surface of the substrate 30 provided with the coating layer 33) is faced down, the nozzle 12 and the substrate 30 are moved relative to each other (see FIGS. 2A, 2B, and 3A), whereby the coating liquid 38A is applied to the desired region (specifically, the region of the insulation film 32 to be provided with the channel formation region 38) of the substrate 30 (see the schematic partly end elevation diagram in FIG. 7C). Thereafter, the coating liquid 38A is dried, whereby a pattern composed of a dried coating layer, i.e., the channel formation region 38 formed of P3HP can be obtained (see the schematic partly end elevation diagram in FIG. 7D).

[Step 320]

Next, a gate insulation layer 35 is formed over the entire surface. Specifically, the gate insulation layer 35 of $SiO_2$ is formed on the entire surface (specifically, on the channel formation region 38 and the coating layer 33) on the basis of a sputtering method (see the schematic partly end elevation diagram in FIG. 8A).

[Step 330]

Thereafter, a gate electrode 34 is formed on the gate insulation layer 35. Specifically, the same step as [Step 100] in Embodiment 1 is carried out. To be more specific, first, a coating layer 37 formed of octadecyltrimethoxysilane (OTS) from which the portion to be provided with the gate electrode 34 has been removed is formed on the gate insulation layer 35 by a PDMS stamp method, for example. Then, the patterning method according to the present invention is applied. Specifically, in the condition where the nozzle 12 for applying an aqueous PEDOT/PSS solution as the coating liquid is disposed on the lower side of the substrate 30 (see FIGS. 1A, 1B, and 2A) and the surface of the substrate 30 controlled in wettability (namely, the surface of the substrate 30 provided with the coating layer 37) is faced down, the nozzle 12 and the substrate 30 are moved relative to each other (see FIGS. 2A, 2B, and 3A), whereby the coating liquid is applied to the desired region (specifically, the region of the gate insulation layer 35 where the gate electrode 34 is to be formed) of the substrate 30. Thereafter, the coating liquid is dried, whereby a pattern composed of a dried coating layer, i.e., the gate electrode 34 formed of PEDOT/PSS can be obtained (see the schematic partly end elevation diagram in FIG. 8B).

[Step 340]

Finally, the same step as [Step 140] in Embodiment 1 is carried out, whereby a top-gate/bottom-contact type organic field effect transistor can be obtained.

Specifically, the top-gate/bottom-contact type organic field effect transistor includes:

(a) the source/drain electrodes 36 formed on the substrate 30, (b) the channel formation region 38 formed on the portion, between the source/drain electrodes, of the substrate 30, (c) the gate insulation layer 35 formed on the channel formation region 38, and (d) the gate electrode 34 formed on the gate insulation layer 35.

Embodiment 4

Embodiment 4 relates to the patterning method according to the one embodiment of the present invention and the method of manufacturing an organic field effect transistor according to the yet further embodiment of the present invention. Now, the patterning method in Embodiment 4 and the method of manufacturing an organic field effect transistor in Embodiment 4 will be described below referring to FIGS. 9A to 9D and FIGS. 10A and 10B which are schematic partly end elevation diagrams of a substrate or the like. In Embodiment 4, also, the patterning method is applied to the formation of a gate electrode and the formation of a channel formation region, in the organic field effect transistor.

[Step 400]

First, a channel formation region 38 and channel formation region extension portions 39 are formed on a substrate 30.

For this purpose, first, a coating layer 33 composed of octadecyltrimethoxysilane (OTS) from which the portion to be provided with the channel formation region 38 has been removed is formed by a PDMS stamp method, for example. This condition is shown in the schematic partly end elevation diagram of FIG. 9A.

Then, in the condition where a nozzle 12 for applying an organic semiconductor material coating liquid composed of a toluene solution of P3HP (5 g/l) is disposed on the lower side of the substrate 30 (see FIGS. 1A, 1B, and 2A) and the surface of the substrate 30 controlled in wettability (namely, the surface of the substrate 30 provided with the coating layer 33) is faced down, the nozzle 12 and the substrate 30 are moved relative to each other (see FIGS. 2A, 2B, and 3A), whereby the organic semiconductor material coating liquid 38A is applied to the portion of the substrate 30. This condition is shown in the schematic partly end elevation diagram of FIG. 9B. Thereafter, the organic semiconductor material coating liquid 38A is dried, whereby the channel formation region 38 and the channel formation region extension portions 39 composed of P3HP which is an organic semiconductor material can be obtained (see the schematic partly end elevation diagram in FIG. 9C).

Or, in other words, in the condition where the nozzle 12 for applying the toluene solution of P3HP as the coating liquid is disposed on the lower side of the substrate 30 (see FIGS. 1A, 1B, and 2A) and the surface of the substrate 30 controlled in wettability (namely, the surface of the substrate 30 provided with the coating layer 33) is faced down, the nozzle 12 and the substrate 30 are moved relative to each other (see FIGS. 2A, 2B, and 3A), whereby the coating liquid 38A is applied to the desired region (specifically, the region of the insulation layer 32 to be provided with the channel formation region 38) of the substrate 30 (see the schematic partly end elevation diagram in FIG. 9B). Thereafter, the coating liquid 38A is dried, whereby a pattern composed of a dried coating layer, i.e., the channel formation region 38 and the channel formation region extension portions 39 which are formed of P3HP can be obtained (see the schematic partly end elevation diagram in FIG. 9C).

[Step 410]

Thereafter, source/drain electrodes 36 are formed on the channel formation region extension portions 39. Specifically, a titanium (Ti) layer (not shown) as a close contact layer and a gold (Au) layer as the source/drain electrodes 36 are sequentially formed on the basis of a vacuum evaporation method. In this manner, the structure shown in FIG. 9D can be obtained. At the time of forming the source/drain electrodes 36, the region where to form the channel formation region 38 is covered with a hard mask, whereby the source/drain electrodes 36 can be formed without any photolithographic process.

[Step 420]

Next, a gate insulation layer 35 is formed over the entire surface. Specifically, the gate insulation layer 35 composed of $SiO_2$ is formed on the entire surface (specifically, on the channel formation region 38 and the source/drain electrodes 36) on the basis of a sputtering method (see the schematic partly end elevation diagram in FIG. 10A).

[Step 430]

Thereafter, the same step as [Step 330] in Embodiment 3 is carried out. Namely, a gate electrode 34 is formed on the gate insulation layer 35. For this purpose, first, a coating layer 37 composed of octadecyltrimethoxysilane (OTS) from which the portion where to form the gate electrode 34 has been removed is formed on the gate insulation layer 35 by a PDMS stamp method, for example. Next, the patterning method according to the present invention is applied. Specifically, in the condition where the nozzle 12 for applying an aqueous PEDOT/PSS solution as the coating liquid is disposed on the lower side of the substrate 30 (see FIGS. 1A, 1B, and 2A) and the surface of the substrate 30 controlled in wettability (namely, the surface of the substrate 30 provided with the coating layer 37) is faced down, the nozzle 12 and the substrate 30 are moved relative to each other (see FIGS. 2A, 2B, and 3A), whereby the coating liquid is applied to the desired region (specifically, the region of the gate insulation layer 35 to be provided with the gate electrode 34) of the substrate 30. Thereafter, the coating liquid is dried, whereby a pattern composed of a dried coating layer, i.e., the gate electrode 34 formed of PEDOT/PSS can be obtained (see the schematic partly end elevation diagram in FIG. 10B).

[Step 440]

Finally, the same step as [Step 140] in Embodiment 1 is carried out, whereby a top-gate/top-contact type organic field effect transistor can be obtained.

Specifically, the top-gate/top-contact type organic field effect transistor includes:

(a) the channel formation region 38 and the channel formation region extension portions 39 which are formed on the substrate 30, (b) the source/drain electrodes 36 formed on the channel formation region extension portions 39, (c) the gate insulation layer 35 formed on the source/drain electrodes 36 and the channel formation region 38, and (d) the gate electrode 34 formed on the gate insulation layer 35.

Embodiment 5

Embodiment 5 relates to the patterning method according to the one embodiment of the present invention. In Embodiment 5, a substrate 30 is provided with a recess-projection structure having a recessed portion as a desired region and a projected portion, whereby the wettability of the surface of the substrate 30 is controlled. Then, a coating liquid is applied to the recessed portion. Further, after a pattern composed of a dried coating layer is formed, the pattern is transferred onto a second substrate.

Figure 11A:
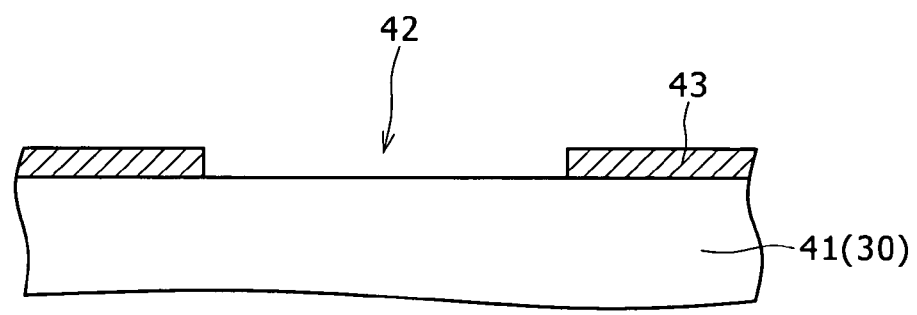
FIGS. 11A and 11B are schematic partly sectional diagrams of a substrate or the like for illustrating a patterning method in Embodiment 5.

Specifically, as a schematic partly end elevation diagram is shown in FIG. 11A, the substrate 30 composed of a glass substrate 41 is provided with a recess-projection structure having a recessed portion 42 as a desired region and a projected portion 43. Incidentally, the projected portion 43 is formed of perfluorooctyltrichlorosilane in a thickness of several nanometers, and can be formed by a lift-off method, for example.

Figure 11B:
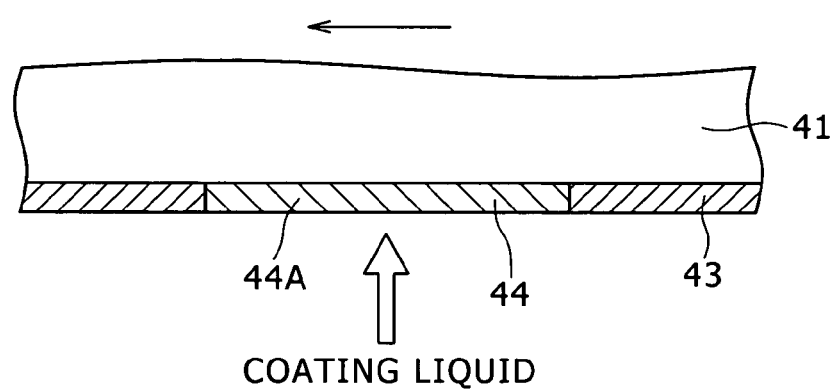

In this condition, the patterning method according to the present invention is carried out. Specifically, in the condition where a nozzle 12 for applying a toluene solution of P3HP as a coating liquid is disposed on the lower side of the substrate 30 (see FIGS. 1A, 1B, and 2A) and the surface of the substrate controlled in wettability (namely, the surface of the substrate 30 provided with the recess-projection structure) is faced down, the nozzle 12 and the substrate 30 are moved relative to each other (see FIGS. 2A, 2B, and 3A), whereby the coating liquid 44A is applied to the desired region (specifically, the recessed portion 42) of the substrate 30 (see the schematic partly end elevation diagram in FIG. 11B). Thereafter, the coating liquid 44A is dried, whereby a pattern 44 composed of a dried coating layer, i.e., a layer constituting the channel formation region composed of P3HP, for example, can be obtained.

Thereafter, a layer constituting the channel formation region which is the pattern may be transferred, for example, to a second substrate in the state shown in FIG. 5A, a second substrate in the state shown in FIG. 6A (it should be noted that it is unnecessary to form the coating layer 37), a second substrate in the state shown in FIG. 7A, or a second substrate in the state shown in FIG. 9A (it should be noted that it is unnecessary to form the coating layer 33), to thereby forming the channel formation region 38 as the desired pattern on the second substrate.

Or, alternatively, a method may be adopted wherein the coating liquid 44A is applied to the desired region (specifically, the recessed portion 42) of the substrate 30, and then the coating liquid 44A is dried, whereby a pattern 44 composed of a dried coating layer, i.e., a layer constituting a gate electrode composed of PEDOT/PSS, for example, can be obtained. Thereafter, the layer constituting the gate electrode as the pattern may be transferred, for example, to a second substrate in the state shown in FIG. 4A (it should be noted that it is unnecessary to form the coating layer 33) or to a second substrate in the state shown in FIG. 8A, to thereby form the gate electrode 34 as the desired pattern on the second substrate.

Or, a method may be adopted wherein the coating liquid 44A is applied to the desired region (specifically, the recessed portion 42) of the substrate 30, and then the coating liquid 44A is dried, whereby a pattern 44 composed of a dried coating layer, i.e., a layer constituting source/drain electrodes composed of PEDOT/PSS, for example, can be obtained. Thereafter, the layer constituting the source/drain electrodes as the pattern may be transferred, for example, to a second substrate in the state shown in FIG. 4D, a second substrate in the state before the formation of the source/drain electrodes 36 shown in FIG. 7A, or a second substrate in the state shown in FIG. 9C, to thereby form the source/drain electrodes 36 as the desired pattern on the second substrate.

Specific examples of the method for transferring the pattern onto the second substrate include a method in which, for example, poly-3-hexylthiophene (P3HP) as an ink is mounted on a projected portion of a stamp having a recess-projection structure (a stamp formed from a fluoro-resin, a stamp formed from a substrate surface-treated with a fluoro-resin, or a stamp treated with 10 mmol OTS), thereafter the P3HP mounted on the projected surface of the stamp is transferred onto a PDMS (silicone rubber) flat over the entire surface, then the P3HP transferred onto the PDMS is transferred onto the second substrate.

Embodiment 6

Embodiment 6 is a modification of Embodiment 5. Now, the patterning method in Embodiment 6 will be described below referring to FIGS. 12A to 12D which are schematic partly sectional diagrams of a substrate or the like.

Figure 12A:
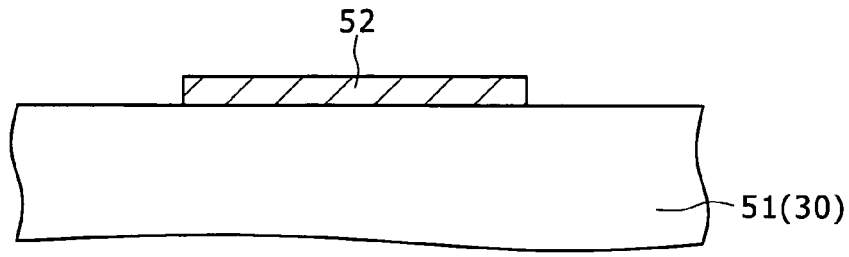
FIGS. 12A to 12D are schematic partly sectional diagrams of a substrate or the like for illustrating a patterning method in Embodiment 6.

In Embodiment 6, first, a resist layer 52 is formed on the surface of a substrate 30 composed of a glass substrate 51, based on the known photolithographic technique (see FIG. 12A).

Figure 12B:
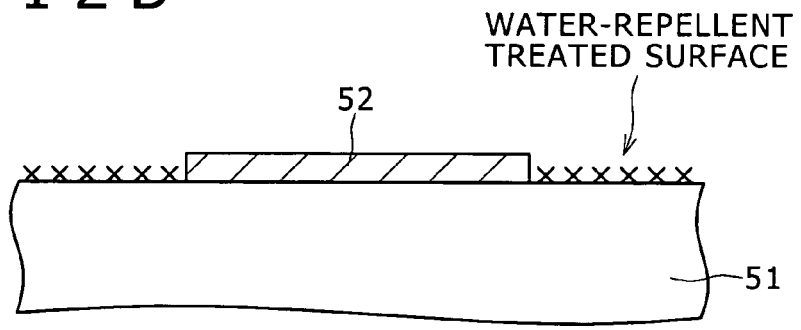

Next, the whole body of the substrate is dipped in a metaxylene hexafluoride solution of perfluorooctyltrichlorosilane which is a liquid-repellent surfactant (contact angle θ'=about 120° when in contact with the glass substrate 51), or is exposed to the vapor of this solution, whereby the portion of the substrate 30 not covered with the resist layer 52 is treated to be water-repellent (see FIG. 12B).

Figure 12C:
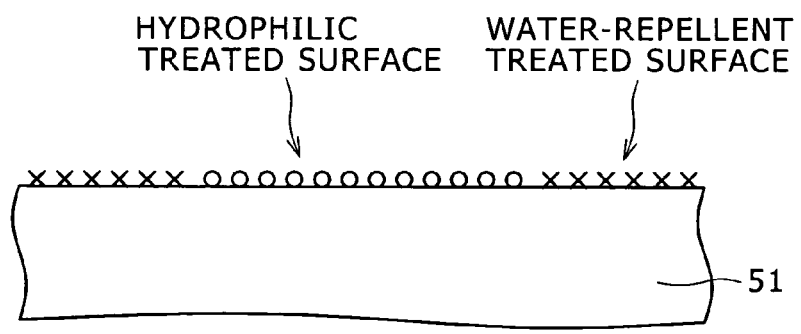
Figure 12D:
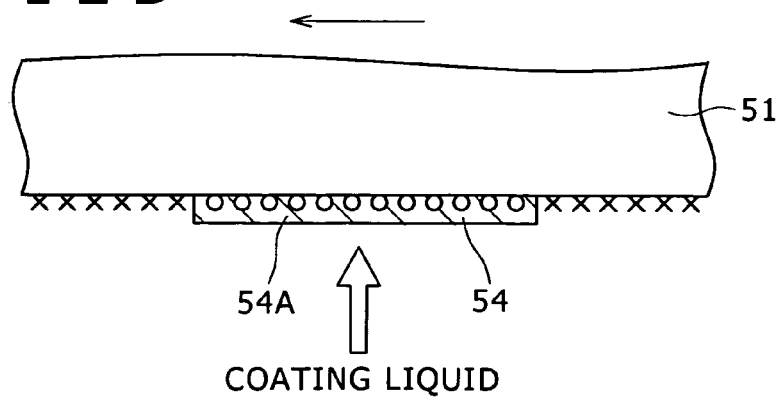

Subsequently, after the removal of the resist layer 52, the whole body of the substrate is dipped in an anhydrous ethanol solution of aminotrichlorosilane which is a lyophilic surfactant (contact angle θ=not more than about 30° when in contact with the glass substrate 51), whereby the portion of the substrate 30 having been covered with the resist layer 52 is treated to be hydrophilic (see FIG. 12C). Incidentally, aminotrichlorosilane would not adhere to the water-repellent treated surface.

In this condition, the patterning method according to the one embodiment of the present invention is carried out. Specifically, in the condition where a nozzle 12 for applying an aqueous solution of PEDOT/PSS which is the coating liquid is disposed on the lower side of the substrate 30 (see FIGS. 1A, 1B, and 2A) and the surface of the substrate 30 controlled in wettability (namely, the surface of the substrate 30 having the hydrophilic treated surface and the water-repellent treated surface) is faced down, the nozzle 12 and the substrate 30 are moved relative to each other (see FIGS. 2A, 2B, and 3A), whereby the coating liquid 54A is applied to the desired region (specifically, the hydrophilic treated surface) of the substrate 30 (see the schematic partly end elevation diagram in FIG. 12D). Thereafter, the coating liquid 54A is dried, whereby a pattern 54 composed of a dried coating layer can be obtained. Thereafter, it suffices that the pattern is transferred onto a second substrate by the same method as described in Embodiment 5.

Embodiment 7

Embodiment 7 relates to the method of manufacturing a flexible printed circuit board according to the still another embodiment of the present invention.

In the method of manufacturing a flexible printed circuit board in Embodiment 7, first, a surface of a substrate 30 composed of a PES film with a thickness of 100 μm, for example, is subjected to an oxygen plasma treatment, whereby the surface of the substrate 30 becomes a hydrophilic treated surface. Next, toner particles are transferred and fixed onto the surface of the substrate 30 by use of a dry indirect electrostatic copying machine, whereby a liquid-repellent region composed of the toner particles and patterned is formed on the surface of the substrate 30. Incidentally, since the substrate 30 is flexible, the above operations can be conducted on a roll form substrate 30 on the so-called roll-to-roll basis.

Next, in the condition where a nozzle 12 for applying a conductive material coating liquid composed of an aqueous PEDOT/PSS solution, for example, is disposed on the lower side of the substrate 30 (see FIGS. 1A, 1B, and 2A) and the surface of the substrate controlled in wettability (the surface of the substrate 30 which is provided thereon with the liquid-repellent region composed of the toner particles and patterned, the other region being the hydrophilic treated surface) is faced down, the nozzle 12 and the substrate 30 are moved relative to each other (see FIGS. 2A, 2B, and 3A), whereby the conductive material coating liquid is applied to the substrate 30, and then the conductive material coating liquid is dried, whereby a circuit pattern (flexible printed circuit board) composed of the dried conductive material coating layer (specifically, a PEDOT/PSS layer) can be obtained. Incidentally, in some cases, the circuit pattern thus obtained may be transferred onto a second substrate.

While the present invention has been described above based on the preferred embodiments thereof, the invention is not limited to or by the embodiments. The structures or configurations, manufacturing conditions, and the manufacturing methods of the organic field effect transistors and the flexible printed circuit board as above-described are mere examples, and can therefore be modified appropriately. In the case where the organic field effect transistors (TFTs) obtained according to the present invention are applied to or used in displays or various electronic apparatuses, a multiplicity of the TFTs may be integrated on a support body or support member to obtain a monolithic integrated circuit, or the respective TFTs may be cut off individually to be used as discrete component parts. In addition, the patterning method according to the one embodiment of the present invention is applicable, for example, to the manufacture of organic electroluminescence displays, organic solar cells, various sensors, and color filters.

What is claimed is:

1. A method of manufacturing a flexible printed circuit board, the method comprising:
   moving a nozzle from an unelevated position to an elevated position;
   forming a gate electrode on a substrate by moving the nozzle and the substrate relative to each other so as to apply a first semiconductor material coating liquid to a surface of said substrate, said nozzle being disposed on a lower side of said substrate and said substrate being faced down with the surface of said substrate including a first recess-projection structure having a first recessed portion and a first projected portion being controlled in wettability so as thereby to apply said first semiconductor material coating liquid to the first recessed portion of said substrate so as to form a first uniform semiconductor coating layer such that an entire coating thickness of the first semiconductor coating layer is substantially equal to an entire thickness of a material of the first projected portion, wherein the first semiconductor coating layer contacts the first projected portion and wherein when the substrate is faced upwardly, an uppermost surface of the material of the first projected portion is formed to be substantially flush with an uppermost surface of the first uniform semiconductor coating layer and a lowermost surface of the material of the first projected portion is formed to be substantially flush with a lowermost surface of the first uniform semiconductor coating layer, said first semiconductor coating liquid being applied as a liquid by capillarity;

drying said first semiconductor material coating liquid so as thereby to obtain a circuit pattern including a semiconductor material coating layer for formation of the gate electrode;

forming a gate insulation layer adjacent to the gate electrode;

forming source and drain electrodes adjacent to the gate insulation layer; and moving the nozzle from the elevated position to a lowered position.

2. The method of manufacturing a flexible printed circuit board of claim 1, further comprising:

forming a channel formation region between the source and drain electrodes by moving the nozzle and the source and drain electrodes relative to each other so as to apply a second semiconductor material coating liquid to a surface between said source and drain electrodes, said nozzle being disposed on a lower side of said source and drain electrodes and said source and drain electrodes being faced down with the surface between said source and drain electrodes including a second recess-projection structure having a second recessed portion and a second projected portion being controlled in wettability so as thereby to apply said second semiconductor material coating liquid to the second recessed portion of said source and drain electrodes so as to form a second uniform semiconductor coating surface such that an entire coating thickness of the second semiconductor coating surface is substantially equal to a thickness of the second projected portion, said second semiconductor coating liquid being applied as a liquid by capillarity; and drying said second semiconductor material coating liquid so as thereby to form the channel formation region.

3. The method of manufacturing a flexible printed circuit board of claim 1, wherein the first semiconductor material coating liquid comprises an organic material.

4. The method of manufacturing a flexible printed circuit board of claim 2, wherein the second semiconductor material coating liquid comprises an organic material.

5. The method of manufacturing a flexible printed circuit board of claim 1, wherein the relationship of $\theta<\theta'$ is satisfied, where $\theta$ is a contact angle between a desired region of said substrate and said first semiconductor coating liquid, and $\theta'$ is a contact angle between a region of said substrate other than said desired region and said first semiconductor coating liquid.

6. The method of manufacturing a flexible printed circuit board of claim 1, wherein the substrate comprises an insulation film formed separately from the first projected portion, wherein the insulation film contacts the lowermost surface of the first uniform semiconductor coating layer and the insulation layer contacts the uppermost surface of the first uniform semiconductor coating layer.

7. The method of manufacturing a flexible printed circuit board of claim 6, wherein the insulation film contacts both the first uniform semiconductor coating layer and the first projected portion.

8. The patterning method as set forth in claim 2, wherein forming the channel formation region comprises forming an additional semiconductor layer on the gate insulation layer.

9. The patterning method as set forth in claim 2, wherein the source and drain electrodes are formed on the gate insulation layer.

* * * * *